United States Patent
Yee

(10) Patent No.: US 9,570,284 B1
(45) Date of Patent: Feb. 14, 2017

(54) METHOD AND SYSTEM FOR CONTROLLING A SEMICONDUCTOR FABRICATION PROCESS

(75) Inventor: Abraham F. Yee, Cupertino, CA (US)

(73) Assignee: NVIDIA Corporation, Santa Clara, CA (US)

( * ) Notice: Subject to any disclaimer, the term of this patent is extended or adjusted under 35 U.S.C. 154(b) by 1984 days.

(21) Appl. No.: 12/649,207

(22) Filed: Dec. 29, 2009

Related U.S. Application Data

(62) Division of application No. 11/264,122, filed on Nov. 1, 2005, now Pat. No. 7,964,422.

(51) Int. Cl.
*H01L 21/00* (2006.01)
(52) U.S. Cl.
CPC ..................................... *H01L 21/00* (2013.01)
(58) Field of Classification Search
USPC ................. 438/14–16, 34; 700/106
See application file for complete search history.

(56) References Cited

U.S. PATENT DOCUMENTS

| | | | |
|---|---|---|---|
| 5,270,222 A | 12/1993 | Moslehi | |
| 6,823,231 B1 | 11/2004 | Bode et al. | |
| 6,842,661 B2 | 1/2005 | Chong et al. | |
| 6,995,849 B2 | 2/2006 | Uno et al. | |
| 7,076,318 B2 | 7/2006 | Hayashi | |
| 7,176,133 B2 | 2/2007 | Hues et al. | |
| 7,324,865 B1 * | 1/2008 | Sonderman et al. | 700/121 |
| 7,972,440 B2 * | 7/2011 | Houge et al. | 117/201 |
| 8,183,066 B2 * | 5/2012 | Lee | H01L 21/67167 257/40 |
| 2004/0115843 A1 | 6/2004 | Wack et al. | |

OTHER PUBLICATIONS

Notice of Allowance dated Feb. 16, 2011.

\* cited by examiner

*Primary Examiner* — Fernando L Toledo
*Assistant Examiner* — Neil Prasad
(74) *Attorney, Agent, or Firm* — Artegis Law Group, LLP

(57) ABSTRACT

A method for controlling a semiconductor fabrication process includes the steps of analyzing process-data related to an intermediate-process-step in the fabrication process and adjusting a metal-layer-parameter corresponding to the metal layer based on the process-data.

13 Claims, 5 Drawing Sheets

METHOD AND SYSTEM FOR CONTROLLING A SEMICONDUCTOR FABRICATION PROCESS

CROSS-REFERENCE TO RELATED APPLICATIONS

This application is a divisional of U.S. patent application Ser. No. 11/264,122, filed Nov. 1, 2005, which is hereby incorporated herein by reference.

BACKGROUND OF THE INVENTION

Field of the Invention

The invention relates to a semiconductor fabrication process and, more specifically, to a method and system for controlling a semiconductor fabrication process.

Description of the Related Art

Semiconductor fabrication process is used for fabricating integrated circuits on silicon wafers using methods known in the art, like, for example, lithography. When fabricating transistors at a nano level (for example, in the sub 0.13-micron region), transistor parameters tend to vary due to variation in the control of various substrate processing steps, such as sub-wavelength lithography and Chemical Mechanical Planarization (CMP) process. As a result, there may be variation in the performance of the fabricated integrated circuit from a desired circuit performance.

A feed-forward methodology often times is used for minimizing such effects of process excursions during the semiconductor fabrication process. The feed-forward methodology generally refers to a method of adjusting succeeding steps in the semiconductor fabrication process based on the process-data of preceding steps of the semiconductor fabrication process.

Conventionally, an advance process control (APC) applies the feed-forward methodologies only to steps that effect transistor formation in the semiconductor fabrication process. For example, process-data collected at the poly cd level is used to correct transistor variance by adjusting succeeding steps for example, etching and/or Lightly Doped Drain (LDD) extension implants. However, relying merely on applying feed-forward method during transistor formation may not provide the best performance of the integrated circuits. Therefore, circuit designers may need to over-design (over-calculate and design accordingly) by looking at a scenario where the transistor performance is worst-case. Moreover, scenarios where metal parasitics also deteriorate the circuit performance may also require the circuit designers to over design.

There is therefore, a need of a method and system for minimizing the effect of process excursion in the semiconductor fabrication process.

SUMMARY OF THE INVENTION

An aspect of the invention is to provide a system and a method for minimizing the effect of process excursion in the transistor formation steps and metal layer deposition steps.

In order to fulfill above aspect, the method comprises analyzing process-data of at least one intermediate-process-step in the semiconductor fabrication process. Further, the method comprises adjusting at least one metal-layer-parameter corresponding to at least one metal layer based on the process-data.

BRIEF DESCRIPTION OF THE DRAWINGS

So that the manner in which the above recited features of the invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Various embodiments of the invention provide methods and systems for controlling a semiconductor fabrication process.

The semiconductor fabrication process generally refers to a multiple-step sequence of photographic and chemical processing steps. In the semiconductor fabrication process, semiconductor electronic devices are gradually created on a wafer made of a semi-conducting material. Silicon is the most commonly used semiconductor material, although gallium arsenide, germanium, and other similar materials are used in special applications. The semiconductor fabrication process can comprise preparation of the wafer surface. An oxide layer, for example silicon dioxide ($SiO_2$) can be grown on the prepared wafer surface. The wafer surface can then be patterned and then dopants can be implanted or diffused on the wafer surface to obtain desired electrical properties. At a later step, a gate dielectric can be either grown or deposited. Further, insulating materials to isolate neighboring devices on the wafer can be either grown or deposited.

After the semiconductor devices are fabricated, they are interconnected to form the desired electrical circuits. This interconnection involves depositing of plurality of metal layers and insulating material in the desired pattern. Generally, dielectric materials, such as silicon dioxide or with low-K materials are used as insulating material. The plurality of metal layers can be interconnected by etching holes in the insulating material and depositing a metal, such as copper, in them.

Figure 1:
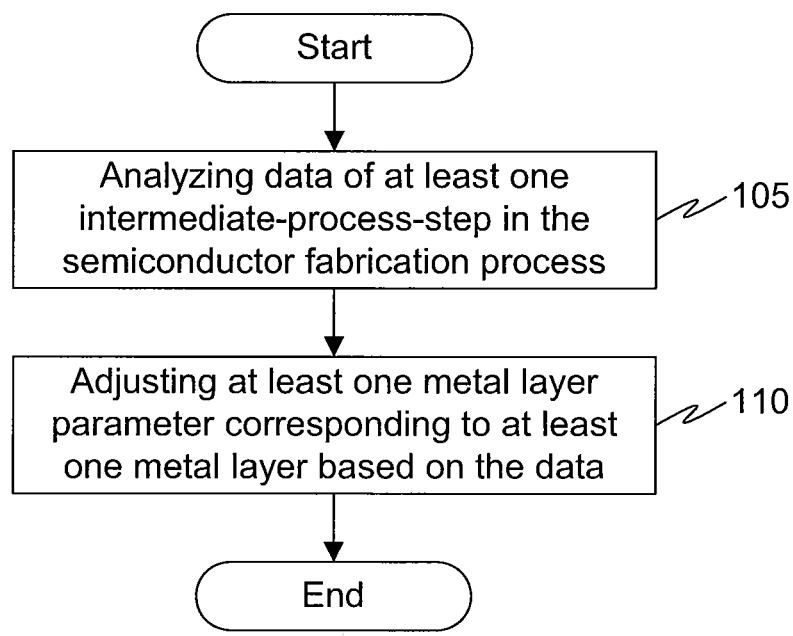
FIG. 1 is a flow diagram of method steps for controlling a semiconductor fabrication process, in accordance with an embodiment of the invention.

FIG. 1 is a flow diagram of a method for controlling a semiconductor fabrication process, in accordance with an embodiment of the invention. At step 105, process-data of at least one intermediate-process-step in the semiconductor fabrication process is analyzed. Process-data corresponding to an intermediate-process-step can comprise voltage, current, resistance, capacitance or a switching property of the circuit at the intermediate-process-step. In an exemplary embodiment of the invention, process-data is collected at an intermediate-process-step after a transistor formation step or at an intermediate-process-step after a metal layer deposition step. For example process-data corresponding to polysilicon linewidths, transistor speed, Miller capacitance, or resistance or capacitance between various contacts, vias or metal lines may be collected. In an embodiment of the invention, the process-data corresponding to an intermediate-process-step can be collected by performing wafer testing on the semiconductor devices.

Conventionally, wafer testing is a step performed during the semiconductor fabrication process by applying special test patterns to the semiconductor devices in a semiconductor wafer. During wafer testing electrical test equipment is interfaced with the semiconductor devices. The electrical test equipment can be an electrical probe having a series of pins. The series of pins of the electric probe are lowered onto the semiconductor devices, whose process-data has to be collected, to make an electrical connection to the semiconductor devices.

In an exemplary embodiment of the invention, the semiconductor devices that are tested are test structures and not the actual semiconductor devices that are connected in the final fabricated integrated circuit. The test structures can be placed in a scribe line, a street or a kerf between functional dies of a semiconductor wafer.

The process-data collected at the intermediate-process-step is then compared with a desired specification of the semiconductor fabrication process. In an embodiment of the invention, a semiconductor device can be simulated in a design environment to obtain simulation process-data. The simulation data can be analyzed to identify at least one critical intermediate-process-step in the semiconductor fabrication process that has significant impact on the performance of the semiconductor device. The process-data corresponding to the at least one critical intermediate-process-step is collected and then compared with a desired specification.

Figure 3:
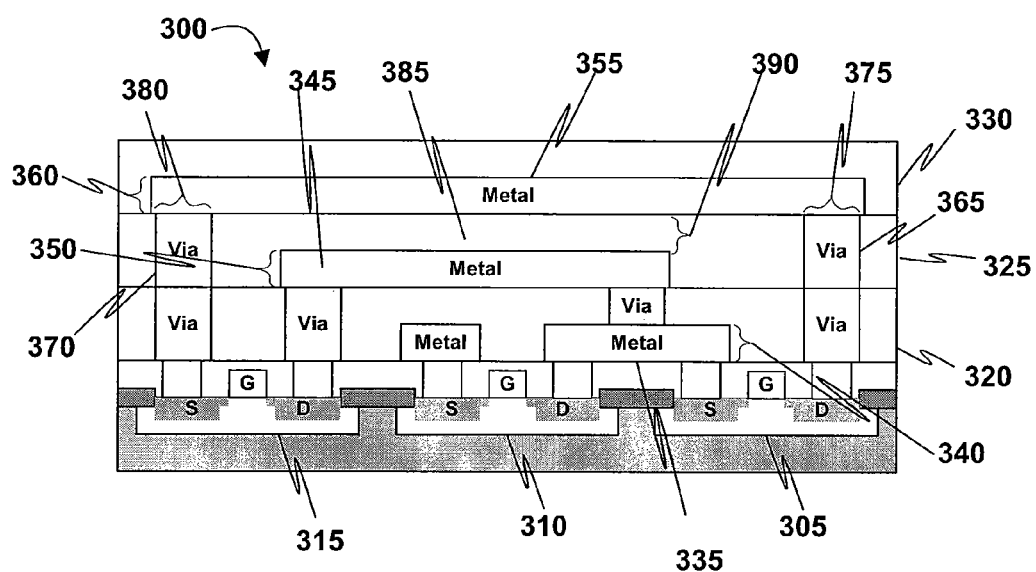
FIG. 3 shows a cross-sectional view of a nano-CMOS device, in accordance with an embodiment of the present invention.

At step 110, at least one metal-layer-parameter corresponding to at least one metal layer is adjusted based on the process-data of a preceding intermediate-process-step. In an embodiment of the invention, test metal structures can be measured to provide an indication of metal-layer-parameters corresponding to the at least one metal layer. The steps of analyzing process-data and adjusting at least one metal-layer-parameter may be performed on the successive metal layers until the final metal layer is deposited in the semiconductor fabrication process. In an embodiment of the invention, a metal-layer-parameter can be, for example, a metal width, a metal thickness, a dielectric thickness, a dielectric constant, a barrier metal thickness or a via thickness, some of these metal-layer parameters are shown in FIG. 3. Varying metal thickness may result in variation in resistance offered by a metal. The dielectric placed between two metal layers forms a capacitance. So, variation in dielectric thickness or variation in dielectric constant may result in variation in capacitance offered by the two metal layers and the dielectric. Therefore, adjusting the metal thickness of a metal layer or the dielectric thickness may compensate for any variations in performance measured at a preceding intermediate-process-step in the semiconductor fabrication process. In an embodiment of the invention, at least one metal-layer-parameter corresponding to a metal layer can be adjusted based on the feed forward methodology. In an exemplary embodiment of the invention, at least one metal-layer-parameter corresponding to a metal layer is adjusted by performing advance process control (APC) over the metal layer. For example, if process-data corresponding to an intermediate-process-step after the transistor formation step implies that the speed of the transistor is slow with respect to a desired value, a successive metal layer can be deposited such that the thickness of the metal corresponding to the successive metal layer is adjusted to achieve a reduced resistance offered by the metal layer. Therefore, compensating for variations introduced in the performance due to the slow transistor.

In an embodiment of the invention, at least one metal-layer-parameter corresponding to a first metal layer that is deposited over a transistor layer is adjusted based on process-data collected after formation of at least one transistor. At least one metal-layer-parameter corresponding to a second metal layer that is deposited over the first metal layer is then adjusted based on process-data collected during the first metal layer deposition step and so forth. Those skilled in the art, however, will appreciate that any combination of adjusting a metal-layer-parameter can be carried out based on process-data collected during an intermediate-process-step of semiconductor fabrication and all such combinations are within the scope of the invention.

Figure 2:
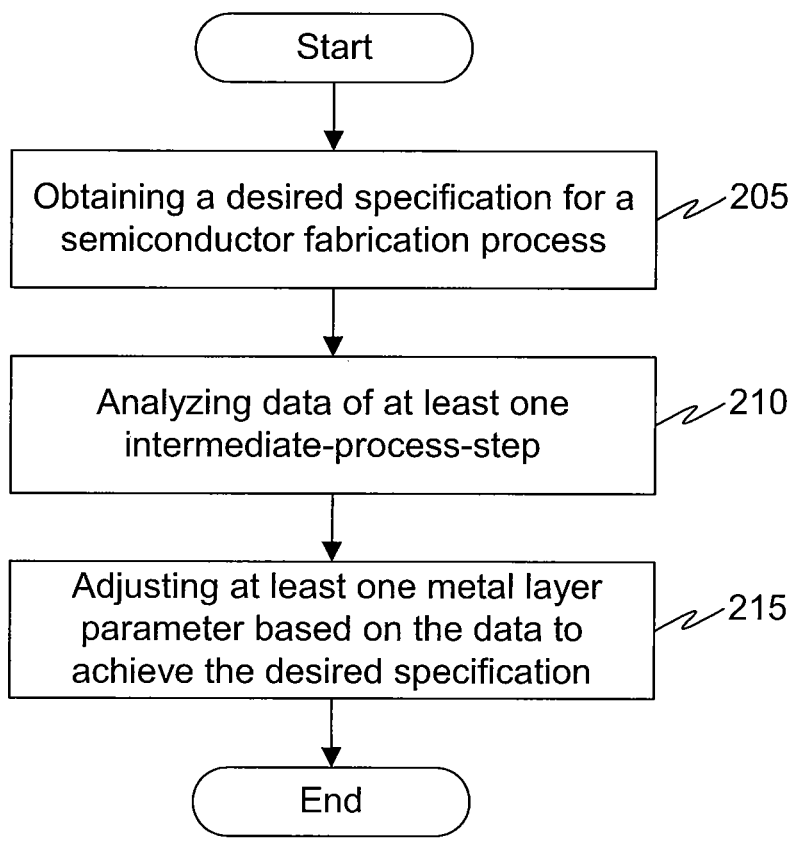
FIG. 2 is a flow diagram of method steps for reducing the variability in a nano-complementary metal oxide semiconductor (nano-CMOS) process, in accordance with an embodiment of the invention.

FIG. 2 is a flow diagram of a method for reducing the variability in a nano-complementary metal oxide semiconductor (nano-CMOS) process, in accordance with an embodiment of the invention.

In a metal oxide semiconductor (MOS) fabrication process, a plurality of MOS transistors is fabricated in a silicon substrate through a series of semiconductor fabrication process steps. In a nano-CMOS semiconductor fabrication process, n-channel and p-channel transistors are fabricated on a monolithic silicon substrate. Typically, the p-channel transistors are located within an n-type region of the silicon substrate and the n-channel transistors are located within a p-type portion of the silicon substrate.

At step 205, a desired specification for the semiconductor fabrication process is obtained. In an embodiment of the invention, the desired specification can either be obtained from a user or from a computing device. The desired specification is predefined and may comprise circuit performance parameters such as desired output and desired circuit properties. The desired outputs may be, for example, a desired voltage, a desired current and a desired switching property. The desired circuit properties may be for example, but not limited to, a predefined resistance and a predefined capacitance of the circuit.

At step 210, process-data of at least one intermediate-process-step in the semiconductor fabrication process is analyzed. Process-data corresponding to an intermediate-process-step can comprise voltage, current, resistance, capacitance or a switching property of the circuit at the intermediate-process-step. In an exemplary embodiment, process-data is collected at an intermediate-process-step after a transistor formation step or at an intermediate-process step after a metal layer deposition step. In an embodiment of the invention, process-data of at least one intermediate-process-step in the semiconductor fabrication process is compared with the desired specification, which may be obtained from a user or a computing device. Based on the comparison a variance between the process-data and the desired specification is obtained. Further, it may be determined if the variance is below a predefined-variance-threshold, for example, a permitted deviation from the desired specification.

At step 215, the at least one metal-layer-parameter corresponding to the at least one metal layer is adjusted based on the process-data to achieve the desired specification. In an embodiment of the invention, a metal-layer-parameter can be for example, a metal width, a metal thickness, a dielectric thickness, a dielectric constant, a barrier metal thickness or a via thickness. A metal-layer-parameter is adjusted based on the comparison between the process-data and the desired specification. For example, an output current is measured at an intermediate-process-step and the output current is compared with a desired specification for the output current. Also, a predefined-variance-threshold is defined for the output current such that the difference between the output current and the desired specification does not exceed the predefined-variance-threshold. The predefined-variance-threshold can be determined theoretically or experimentally. Further, if the output current measured at the intermediate-process-step is more or less than the current required according to the desired specifications, the invention employs APC to deposit the successive metal layer such that the thickness of the metal is less or more. As a result, the resistance of the metal layer increases or decreases and in turn the output current decreases or increases while keeping other circuit parameters, such as voltage, constant. The process of collecting process-data and adjusting a metal-layer-parameter may be performed on all the successive metal layers until the final metal layer is deposited in the semiconductor fabrication process. As a result, variability in nano-CMOS process in the semiconductor fabrication process is reduced.

In an embodiment of the invention, the semiconductor fabrication can deploy a sampling algorithm depending on the variability in the semiconductor fabrication process. For example, in a mature technology, with a wafer size of 300 mm, the sampling algorithm can be deployed on 9 sites on 5 wafers of a 25 wafer lot. In a less mature process, the sampling algorithm can be deployed on 25 sites on every wafer, thus facilitating wafer-to-wafer adjustment. Those skilled in the art shall realize that a sampling algorithm, which is consisted with a desired cost of testing and a required need to maintain the advance process control, can be provided and falls within the scope of the invention.

In an embodiment of the invention, the methods explained in conjunction with FIG. 1 and FIG. 2 can be implemented as a computer program product.

FIG. 3 shows a cross-sectional view 300 of nano-CMOS devices, in accordance with an exemplary embodiment of the invention. A nano-CMOS device 305, a nano-CMOS 310 and a nano-CMOS 315 are fabricated in a silicon substrate through series of semiconductor fabrication process steps. To form an electrical circuit a metal layer 320, a metal layer 325 and a metal layer 330 interconnect nano-CMOS device 305, nano-CMOS device 310 and nano-CMOS device 315. The metal layers can comprise dielectrics (insulating layers separating the metal layer wires), vias and metal connections. Those skilled in the art shall appreciate that vias generally connect two metal layers and they can be made of a metallic material connecting a metal connection in one metal layer with a metal connection in another metal layer.

If the process-data of an intermediate-process-step after the formation of nano-CMOS device 305, nano-CMOS device 310 and nano-CMOS device 315 suggests that their respective speeds are slow with respect to a pre-defined target, then, in order to obtain desired specification, the succeeding steps can be adjusted to compensate for the variations in the preceding steps. In an exemplary embodiment of the invention, the metal layer 320 can be deposited such that thicker metal connections are acquired. As a result, the resistance offered by metal connection 335 is lesser therefore, compensating for the slow speed of nano-CMOS device 305, nano-CMOS device 310 and nano-CMOS device 315. As depicted in FIG. 3, an example of thickness of metal connection 335 is shown at 340, thickness of metal connection 345 is shown at 350 and thickness of metal connection 355 is shown at 360.

In another exemplary embodiment of the invention, if the process-data of an intermediate-process-step corresponding to deposition of metal layer 320 suggests that at least one metal-layer-parameter deviates from a desired specification, the succeeding steps can then further be adjusted. Metal-layer-parameter, such as metal thickness, dielectric thickness, dielectric constant or via thickness, corresponding to metal layer 325 and metal layer 330 can be adjusted to compensate for the variations in preceding intermediate-process-step to get an average performance across the wafer. As shown in the FIG. 3, metal connection 355, a via 365 and a via 370 form an electrical connection between nano-CMOS device 305 and nano-CMOS device 315. While depositing metal layer 325, thickness of via 365 and thickness of via 370 (shown at 375 and 380 respectively) is adjusted to compensate for the variation in performance of the circuit when metal layer 320 was deposited. Similarly, while depositing metal layer 330, thickness of the metal connection 355 shown at 360, is adjusted depending on the variation in performance of the circuit when metal layer 325 was deposited. Those skilled in the art shall realize that varying a dielectric thickness of an insulating layer or varying a dielectric constant of an insulating layer can also affect the capacitance formed by that metal layer with an adjacent metal layer. For example, variation in thickness of a dielectric 385 shown at 390 or varying the dielectric constant of dielectric 385 may affect the capacitance formed by metal layer 325 and 330. Therefore, metal layers can be adjusted to vary corresponding metal-layer-parameters to compensate for variation in the preceding steps. As described earlier, APC may be employed for these adjustments.

Figure 4:
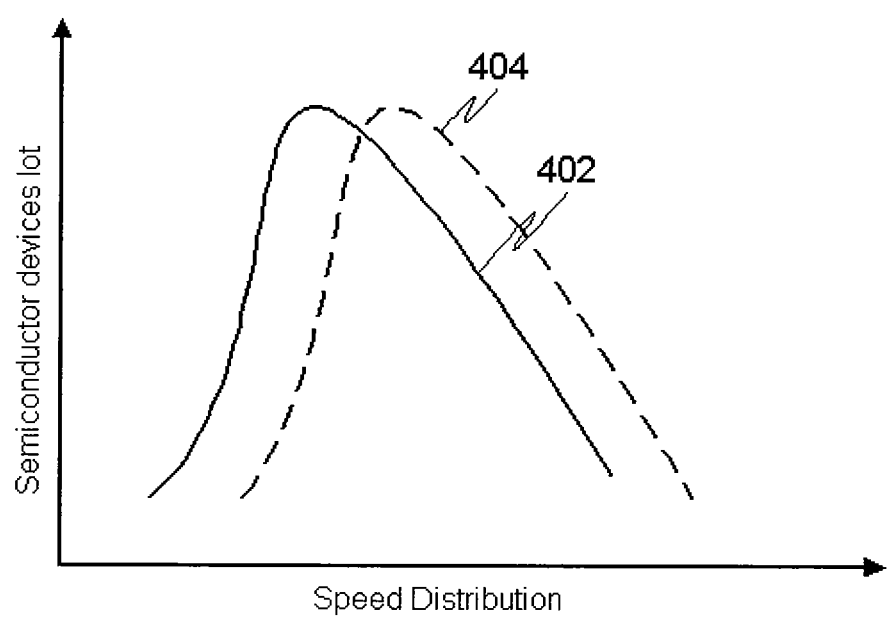
FIG. 4 illustrates the effect of advance process control (APC) on semiconductor device performance, in accordance with an embodiment of the invention.

FIG. 4 illustrates the effect of APC on semiconductor device performance, in accordance with an embodiment of the invention. A curve 402 shows the speed distribution of the semiconductor devices obtained without employing APC in a semiconductor fabrication process. A curve 404 shows the speed distribution of the semiconductor devices obtained after employing APC (in accordance with an embodiment of the invention) in the semiconductor fabrication process. As is evident from FIG. 4, the average speed of the semiconductor devices increased after employing APC in the semiconductor fabrication process.

Figure 5:
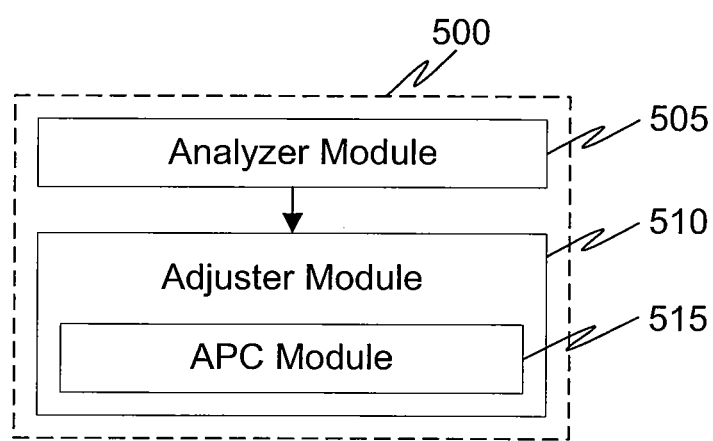
FIG. 5 is a block diagram of a system for controlling a semiconductor fabrication process, in accordance with an embodiment of the invention.

FIG. 5 illustrates a block diagram of a system 500 for controlling the semiconductor fabrication process, in accordance with an embodiment of the invention. System 500 comprises an analyzer module 505 and an adjuster module 510 working in conjunction with each other to control the semiconductor fabrication process.

Analyzer module 505 is adapted to analyze process-data corresponding to at least one intermediate-process-step in the semiconductor fabrication process. In an exemplary embodiment of the invention, process-data is collected at intermediate-process-steps after a transistor formation step or at intermediate-process steps after a metal layer deposition step. In an embodiment of the invention, analyzer module 505 compares process-data of the at least one intermediate-process-step in the semiconductor fabrication process with a desired specification. The desired specifications can be for example, a desired output of the circuit or desired circuit properties. In an embodiment of the invention, analyzer module 505 can be implemented as a software module.

Adjuster module 510 adjusts at least one metal-layer-parameter corresponding to the at least one metal layer in the semiconductor fabrication process based on the process-data collect at an intermediate-process-step. A metal-layer-parameter can be for example, a metal width, a metal thickness, a dielectric thickness, a barrier metal thickness or a via thickness. Adjuster module 510 comprises an APC module 515. APC module 515 is adapted to perform an APC over the at least one metal layer in the semiconductor fabrication process. Based on the process-data analyzed by analyzer module 505, adjuster module 510 enables APC module 515 to adjust at least one metal-layer-parameter corresponding to a metal layer to achieve the desired specification. Those skilled in the art, however, will appreciate that this process can be performed on all the successive metal layers till the last metal layer is deposited. As a result, accuracy of the semiconductor fabrication process can be improved to achieve the desired specification. In an embodiment of the invention, adjuster module 510 can be implemented as a software module.

The various embodiments of the invention provide a method and system that can reduce the process variability in nano-CMOS process and improve timing in nano-CMOS designs. Further, the various embodiments of the invention provide method and system for minimizing the effect of process excursion in the transistor formation steps and metal layer deposition steps by performing feed forward on the metal thickness. Therefore, designers need not over-design by looking at scenarios where the transistor performance is worst case or where metal parasitic due to processes such as chemical mechanical planarization (CMP) is worst case. Instead the designer can, now, obtain more accurate product performance and design timing by making adjustments to metal layers during the semiconductor fabrication process.

What is claimed is:

1. A non-transitory computer-readable medium storing instructions for causing a computing device to control a fabrication process for a semiconductor device by performing the steps of:
    analyzing process-data related to an intermediate-process-step in the fabrication process for the semiconductor device; and
    adjusting a target value of a metal-layer-parameter corresponding to a metal layer in the semiconductor device based on the process-data,
    wherein the metal layer is generated in a subsequent process step in the fabrication process based on the adjusted target value.

2. The non-transitory computer-readable medium of claim 1, wherein the process-data comprises a transistor property or a metal-layer-parameter.

3. The non-transitory computer-readable medium of claim 1, wherein the intermediate-process-step is a transistor formation step or a metal layer deposition step.

4. The non-transitory computer-readable medium of claim 1, wherein the metal-layer-parameter comprises a metal thickness.

5. The non-transitory computer-readable medium of claim 4, wherein the metal thickness is adjusted such that a resistance of the metal layer is equal to a pre-determined resistance or a capacitance of the metal layer is equal to a pre-determined capacitance.

6. The non-transitory computer-readable medium of claim 1, wherein the step of analyzing comprises comparing the process-data with a desired specification, and the step of adjusting comprises adjusting the metal-layer-parameter based on the process-data to achieve the desired specification.

7. The non-transitory computer-readable medium of claim 6, wherein the intermediate-process-step is a transistor formation step and a metal layer deposition step, and the process-data comprises a transistor property or metal-layer-parameter.

8. The non-transitory computer-readable medium of claim 1, wherein the intermediate-process-step is associated with a layer fabricated prior to the metal layer.

9. The non-transitory computer-readable medium of claim 1, wherein the steps of analyzing process-data and adjusting are performed on successive metal layers until a final metal layer is deposited in the semiconductor device fabrication process.

10. The non-transitory computer-readable medium of claim 1, wherein the metal-layer-parameter comprises one of a metal width, a dielectric thickness, a dielectric constant, a barrier metal thickness, or a via thickness.

11. The non-transitory computer-readable medium of claim 6, wherein the desired specification includes a circuit performance parameter of a circuit of the semiconductor device.

12. The non-transitory computer-readable medium of claim 11, wherein the circuit performance parameter of the circuit includes at least one of an output voltage, an output current, a switching property, a resistance, or a capacitance.

13. The non-transitory computer-readable medium of claim 1, wherein the process-data include at least one of an output voltage of a circuit of the semiconductor device, an output current of the circuit, a resistance of the circuit, a capacitance of the circuit, or a switching property of the circuit.

* * * * *